United States Patent
Reese et al.

(10) Patent No.: US 11,710,799 B2
(45) Date of Patent: Jul. 25, 2023

(54) CONTROLLED THERMOMECHANICAL DELAMINATION OF THIN FILMS

(71) Applicants: Alliance for Sustainable Energy, LLC, Golden, CO (US); Colorado School of Mines, Golden, CO (US)

(72) Inventors: Matthew Owen Reese, Golden, CO (US); Deborah Lee McGott, Golden, CO (US); Michael David Kempe, Littleton, CO (US); Teresa Marie Barnes, Evergreen, CO (US); Colin Andrew Wolden, Denver, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 0 days.

(21) Appl. No.: 16/362,395

(22) Filed: Mar. 22, 2019

(65) Prior Publication Data
US 2019/0296170 A1  Sep. 26, 2019

Related U.S. Application Data

(60) Provisional application No. 62/646,625, filed on Mar. 22, 2018.

(51) Int. Cl.
*H01L 31/048* (2014.01)
*H01L 31/049* (2014.01)

(52) U.S. Cl.
CPC ........ *H01L 31/0481* (2013.01); *H01L 31/049* (2014.12)

(58) Field of Classification Search
None
See application file for complete search history.

(56) References Cited

U.S. PATENT DOCUMENTS

| | | | |
|---|---|---|---|
| 9,263,626 B1* | 2/2016 | Cheng | H01L 31/07 |
| 2008/0149179 A1* | 6/2008 | Romeo | H01L 31/1836 |
| | | | 427/76 |
| 2011/0192463 A1* | 8/2011 | Chuang | H01L 31/18 |
| | | | 136/262 |
| 2016/0183358 A1* | 6/2016 | Al-Saud | H01L 31/1892 |
| | | | 174/261 |
| 2016/0380123 A1* | 12/2016 | Woods | H01L 31/0322 |
| | | | 136/256 |
| 2017/0104113 A1* | 4/2017 | Haight | H01L 31/072 |
| 2018/0248070 A1* | 8/2018 | Farah | H01L 31/03046 |
| 2021/0210650 A1* | 7/2021 | Drost | H01L 31/03925 |

OTHER PUBLICATIONS

Abe, Y. et al., "Development of Flexible Cu(In, Ga)Se2 Thin Film Solar Cell by Lift-Off Process," Intech Europe, Solar Cells—Thin-Film Technologies, Prof. Leonid A. Kosyachenko Editor, 2011, pp. 405-420.

Anegawa, T. et al., "Comparison of lift-off processes and rear-surface characterization of Cu(In,Ga)Se2 thin films for solar cells," Journal of Crystal Growth, vol. 311, 2009, pp. 742-745.

(Continued)

*Primary Examiner* — Nilufa Rahim
(74) *Attorney, Agent, or Firm* — Sam J. Barkley (57) ABSTRACT

Disclosed herein are CdTe-based solar cells that are successfully removed from their glass superstrate through a combination of lamination to a backsheet followed by thermal shock.

6 Claims, 7 Drawing Sheets

(56) References Cited

OTHER PUBLICATIONS

Chantana, J. et al., "Flexible Cu(In,GA)Se2 solar cell with superstrate-type configuration fabricated by a lift-off process," Thin Solid Films, vol. 662, 2018, pp. 110-115.

Clayton-Warwick, D. et al., "Decoupling Thin Film CdTe Growth from Packaging: Toward Record Specific Power in Low Cost Polycrystalline PV," Conference paper for 2017 IEEE PVSC Conference, Jun. 25-30, 2017, Washington, D.C., 4 pages.

Konagai, M. et al., "High Efficiency GaAs Thin Film Solar Cells by Peeled Film Technology," Journal of Crystal Growth, vol. 45, 1978, pp. 277-280.

McGott, D. et al., "Mitigation of Crack Formation During Thermo-Mechanical Delamination of CdTe Solar Cells," IEEE, 7th World Conference on Photovoltaic Energy Conversion (WCPEC), Jun. 2018, 4 pages.

Meysing, D. et al., "Evolution of oxygenated cadmium sulfide (CdS:O) during high-temperature CdTe solar cell fabrication," Solar Energy Materials & Solar Cells, vol. 157, 2016, pp. 276-285.

Minemoto, T. et al., "Lift-Off Process for Flexible Cu(In,Ga) Se2 Solar Cells," Japanese Journal of Applied Physics, vol. 49, 2010, 3 pages.

Perkins, C. et al., "Two-Dimensional Cadmium Chloride Nanosheets in Cadmium Telluride Solar Cells," Applied Materials & Interfaces, vol. 9, 2017, pp. 20561-20565.

Tiwari, A.N. et al., "12.8% Efficiency Cu(In,Ga)Se2 Solar Cell on a Flexible Polymer Sheet," Progress in Photovoltaics: Research and Applications, vol. 7, 1999, pp. 393-397.

Tiwari, A.N. et al., "Flexible CdTe Solar Cells on Polymer Films," Progress in Photovoltaics: Research and Applications, vol. 9, 2001, pp. 211-215.

\* cited by examiner

CONTROLLED THERMOMECHANICAL DELAMINATION OF THIN FILMS

CROSS-REFERENCE TO RELATED APPLICATIONS

This application claims priority under 35 U.S.C. § 119 to U.S. Provisional Patent Application No. 62/646,625 filed on Mar. 22, 2018, the contents of which are hereby incorporated by reference in their entirety.

CONTRACTUAL ORIGIN

The United States Government has rights in this invention under Contract No. DE-AC36-08GO28308 between the United States Department of Energy and Alliance for Sustainable Energy, LLC, the Manager and Operator of the National Renewable Energy Laboratory.

BACKGROUND

Thin film photovoltaics (PV) offer the lowest manufacturing costs, but the use of double glass module construction introduces weight and rigidity that impacts competitiveness from a balance of systems perspective.

CdTe and $CuIn_xGa_{1-x}Se_2$ (CIGS) grown on plastic have low efficiency due to reduced growth temperature and are moderately expensive due to scale. CIGS grown on metal foil have good efficiency but are heavy and have no ability to monolithically interconnect due to metal growth substrate. They are also moderately expensive due to scale. PV on rigid glass is not flexible and is heavy. a-Si on any substrate has poor efficiency and is moderately expensive due to scale. CdTe on plastic has poor efficiency due to temperature constraints, is not scaled, and would be expensive to mass produce. GaAs is prohibitively expensive to produce, especially in scalable quantities.

SUMMARY

Exemplary embodiments of the invention provide materials and methods to grow polycrystalline thin films on an optimal growth substrate with optimal growth conditions for high performance and low processing costs and then rapidly remove the films from the original growth substrate to be repackaged. This enables the production of ultra-lightweight and flexible devices. It also can enable access to buried interfaces, which enable improved performance relative to standard growth processes. There are a variety of applications of the materials disclosed herein that can use high specific power (high power-to-weight ratio) PV.

In an aspect, disclosed is a method for making a polycrystalline device stack film comprising the steps of laminating a polycrystalline device stack on a substrate to a stressor layer wherein the stressor layer and the polycrystalline device stack have a coefficient of thermal expansion (CTE) mismatch between the stressor layer and the polycrystalline device stack and wherein the polycrystalline device stack is delaminated from the substrate to make the polycrystalline device stack film. In an embodiment, the stressor layer comprises a handle layer. In an embodiment, the delamination of the polycrystalline device stack film from the substrate takes place at temperatures less than about −30° C. In another embodiment, the method further consists of the step of laser scribing the polycrystalline device stack prior to the delamination step. In an embodiment, the substrate is glass. In another embodiment, the method of claim 1 further comprising applying a transparent front contact to the polycrystalline device stack film after the delamination step. In an embodiment, the polycrystalline device stack film is crack-free. In an embodiment, the polycrystalline device stack film comprises CdTe. In another embodiment, the polycrystalline device stack film comprises CIGS. In an embodiment, the polycrystalline device stack film made by the method is crack-free. In another embodiment, the polycrystalline device stack film has a post-delamination efficiency of at least 11.4%. In an embodiment, the polycrystalline device stack film has a post-delamination FF of at least 62.8. In another embodiment, the polycrystalline device stack film has a specific weight that is at least 10-fold less than the specific weight of the polycrystalline device stack before delamination from the substrate. In an embodiment, the polycrystalline device stack film has a specific weight of less than 0.8 kg/m². In an embodiment, the polycrystalline device stack film has a $J_{sc}$ of at least 24.5 mA cm$^{-2}$ from a measured device area of about 12 mm². In an embodiment, the polycrystalline device stack film of claim 10 has an areal density of at least 350 gm$^{-2}$. In an embodiment, the polycrystalline device stack film is at least 11.4% efficient. In another embodiment, the polycrystalline device stack film is at least 11.4% efficient and has an areal density that is at least 10-fold less than the same device that has not been delaminated from the substrate.

In an aspect, disclosed herein is a method for a crack-free liftoff of a polycrystalline device stack film that comprises first laminating a polycrystalline device stack device to a polymeric handle and then using materials with a coefficient of thermal expansion (CTE) mismatch between a stressor layer and a substrate to delaminate the polycrystalline device stack film at temperatures less than about −30° C. In an embodiment, the method makes a polycrystalline device stack film is selected from the group consisting of CdTe and CIGS.

Other objects, advantages, and novel features of the present invention will become apparent from the following detailed description of the invention when considered in conjunction with the accompanying drawings.

BRIEF DESCRIPTION OF THE DRAWINGS

FIG. 1(a) depicts a schematic of stack before delamination with stressor and handle applied to back of device (CdTe device architecture seen in inset), and 1(b) after delamination at the CdS/TCO interface, which is weakened by a monolayer accumulation of $CdCl_2$.

FIG. 3(a) depicts a plot of area delaminated as a function of $T_{lam}$. Delamination quality depends on the presence of a ductile (Au) back contact and the substrate used (AF45 vs. SLG) for $T_{delam}$=−196° C. 3(b)-(d) show representative images of delamination quality, with black representing clean delamination. Scale bars are 5 mm.

DETAILED DESCRIPTION

Disclosed herein are embodiments that demonstrate that CdTe-based solar cells can be successfully removed from their glass superstrate through a combination of lamination to a back sheet followed by thermal shock. The mechanics of this thermo-mechanical lift-off process were evaluated using an energy-balance approach, identifying the important factors that control the process. In an embodiment, it is shown that the lamination temperature and device architecture control the quality of the liftoff, while the rate at which the film stack is removed is proportional to the delamination temperature.

Crack-free devices were removed and successfully re-contacted. After lift-off at the front contact interface in superstrate CdTe, device functionality is restored through re-application of a transparent front contact and 11% device efficiency (~80% of original device efficiency) is achieved. The specific weight of these devices is about 0.8 kg/m², a reduction of an order of magnitude relative to their initial weight on glass. The framework developed herein can be applied to polycrystalline thin film architectures, providing alternative pathways for the production of flexible PV with high specific power.

In another embodiment, disclosed are equations to describe thermo-mechanical delamination of thin-film solar cells. Also disclosed are several tunable parameters to control it. Disclosed herein are methods of controlling thermal strain through $T_{lam}$ and $T_{delam}$. However, there are many other parameters that can be tuned to achieve delamination in diverse thin-film systems. Not only can c be altered in numerous ways, but the stressor and handle material can be chosen with larger values of h, E, and a in order to increase delamination probability, G.

In another embodiment, disclosed herein are methods that result in improved delamination that is achieved by modifying device architecture, such as removing the ductile back contact or choosing a substrate with a well matched CTE. In an embodiment, delamination rate can be changed through $T_{delam}$, which is useful in process design.

In another embodiment, disclosed herein is a functioning delaminated device retaining 80% of its original efficiency and also having improvements to current density.

Methods used, and devices disclosed herein are useful for developing high specific power PV as well as buried interfaces in a wide variety of device stacks.

In an embodiment, a method is disclosed wherein as a first step adhered is a handle of known thickness, elastic modulus, and coefficient of thermal expansion to a thin film or thin film stack that can serve as a device (e.g. solar cell). After adhesion of the handle, the complete structure is exposed to a low temperature. This subjects the structure to stresses, which delaminate the structure at a targeted interface. Depending on the delamination interface, further processing may be performed on the device, or its packaging may be completed.

Thin-film photovoltaics, such as CdTe and $CuIn_xGa_{1-x}Se_2$ (CIGS), show promise as low-cost technologies to be used for diverse applications where flexibility and high specific power (power-to-weight ratio) are required (e.g. wearables, portable charging, transportation, building integrated PV). Growing on flexible substrates, however, can often lead to suboptimal devices. For example, growing on polyimide films, while extremely lightweight, requires lower growth temperatures, which can negatively affect device efficiency. CIGS devices grown on polyimide films can obtain efficiencies rivaling those on rigid substrates, but only through extensive process optimization and complicated post-deposition treatments. Stainless steel foils, on the other hand, can withstand high growth temperatures and are commonly used for commercial flexible CIGS modules, yet lighter substrates are desired for applications where weight is a critical factor. Moreover, the highest efficiency superstrate architecture for CdTe devices cannot be employed on these opaque foils.

An alternative method for achieving lightweight, flexible PV involves delaminating the active cell from its growth substrate and repackaging using lightweight plastics. This concept was demonstrated by successfully removing a 40-μm-thick Si layer from a 300-μm-thick Si substrate. This was done by screen-printing metal (Ag and Al) pastes to the surface of the Si substrate, then annealing at 900° C. Upon cooling, the mismatch in coefficient of thermal expansion (CTE) between the Si and metal layers induced enough tensile stress to spontaneously remove the top layer of Si. This technique was later adopted and modified in an effort to re-use expensive single-crystal III-V growth substrates. Disclosed herein is a stressor layer and flexible handle that were applied to the device at room temperature, then pulled in tension to propagate a carefully initiated crack along a preferred crystallographic plane. By doing so, the high-temperature annealing step was eliminated, and more control was gained over device delamination. However, this technique is primarily useful in single-crystal systems and can therefore not be used to delaminate polycrystalline thin-film solar cells effectively.

Delamination is typically considered to be a catastrophic failure in thin-film solar cells, and careful precautions are taken to ensure that it doesn't occur during device fabrication. However, if state-of-the-art devices could be robustly delaminated post-growth and repackaged using lightweight plastics, the specific power would be drastically improved while maintaining low-costs. While this process is now well understood for epitaxial materials, achieving clean delamination is more complicated for polycrystalline thin-films. Disclosed herein are methods for crack-free liftoff of a CdTe device stack through a two-step process that consists of first laminating the device to a polymeric handle and then exploiting the coefficient of thermal expansion mismatch between the stressor layer and glass substrate to cleanly delaminate the CdTe device stack film at low temperatures (T≤−30° C.). This thermo-mechanical delamination has the benefit of exposing previously buried regions of thin-film devices. Delamination of superstrate CdTe films allows direct access to the heterojunction region, making it easily studied through standard surface analysis techniques. Therefore, this thermo-mechanical delamination technique not only decouples final lightweight packaging from high-temperature growth requirements, but facilitates a new understanding that can ultimately help improve device performance in thin-film solar cells.

In an embodiment, thermo-mechanical delamination is achieved using an energy-balance approach and factors that are important to control were determined. By varying thermal strain, key temperature set points are identified and the rate of delamination can be readily controlled. After delamination device functionality was successfully recovered by re-application of a transparent front contact, the device performance relative to the original device was determined. The generality of this approach for polycrystalline thin film systems was demonstrated through the successful delamination of a CIGS device stack.

In an embodiment, different variables that are related to control for successful controlled delamination include handle thickness, elastic modulus, coefficient of thermal expansion, built-in stresses from application temperature of the handle, associated film properties of film stack to be removed, temperature gradient to effect delamination, and aspect ratio/shape of handle. In an embodiment, these parameters were varied and the effect upon delamination was demonstrated through using a commercially available kynar/PET/EVA (KPE) handle, using an experimental TPU, and by using a commercially available epoxy. The EVA used in the KPE backsheet has a much lower vinyl acetate content than EVA typically used as an encapsulant in the PV industry. This alters the elastic modulus, but has a modest effect on the CTE.

The energy release rate, G~(s^2)*(h)/(2E), where the strain, s, is proportional to E*ΔT*alpha. E is the modulus, h is the thickness, ΔT is the change in temperature, and alpha is the coefficient of thermal expansion or CTE. This supports that the energy release rate goes as the square of the CTE, but that both the thickness and modulus are important.

In an embodiment, the samples that were tested reveal that CTE is in the range of 50-250 ppm/° C., and E is in the range of ~0.1 to 5 GPa (less narrowly perhaps 0.003 to 10 GPa). The effect of other properties were also explored, including thermal conductivities, k, from 0.1 to 1 W/m*K, and Poisson's ratio, v, from 0.3 to 0.5.

Figure 2:
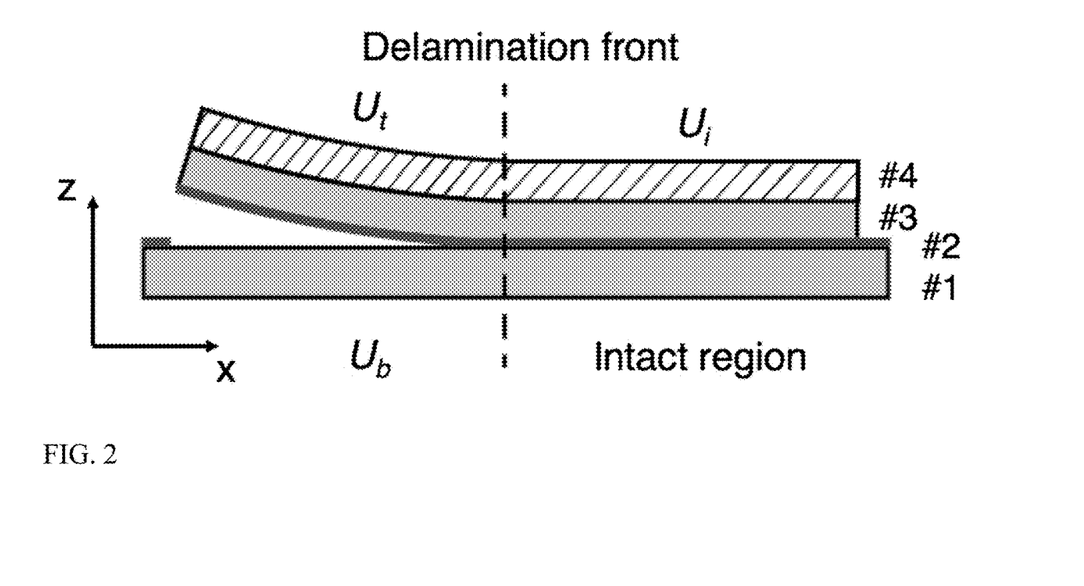
FIG. 2 is an illustration of delamination propagation using an energy-balance approach with four layers: 1) glass, 2) solar cell, 3) stressor, 4) handle. $U_t$, $U_b$, and $U_i$ represent strain energy in the top sub-stack, bottom sub-stack, and intact region, respectively

The mechanism of delamination was investigated to identify the parameters involved. FIG. 2 depicts a schematic illustration of delamination in a simplified system containing only four layers: (1) TCO-coated glass superstrate, (2) thin-film solar cell, (3) EVA stressor, and (4) PET handle. Delamination occurs preferentially between the glass (layer 1) and solar cell (layer 2) due to a weakened interface. Table 1 summarizes the composition and relevant material properties of these layers at ambient temperature. The material property values for EVA are approximate and depend on the vinyl acetate content. In general, larger amounts of vinyl acetate prevent crosslinking and lower the modulus (stiffness). In an embodiment, low vinyl acetate content was used (<10 wt % compared to 28 to 33 wt % for typical encapsulation), and the material properties (modulus, CTE) of EVA in Table 1 are approximate as those for its low-density polyethylene (LDPE) resin precursor. In an embodiment, this gives a general view of EVA properties relative to the other layers.

In an embodiment, Table 1 depicts a summary of layers used in analyses disclosed herein. In an embodiment, layer 1, "Glass" is composed of the glass substrate (either Schott AF45 or soda-lime glass (SLG)) and a transparent conducting oxide (TCO), ($SnO_2$:F/$SnO_2$), layers. TCO is included in layer 1 rather than layer 2 because it is separated from the solar cell during delamination. In an embodiment, layer 2, "Solar Cell" is composed of the remaining layers in the superstrate CdTe device: CdS, CdTe, and in some cases Au. In an embodiment, layer 3, "Stressor" is polyethylene-co-vinyl acetate (EVA) with low vinyl acetate content (<10 wt %). Material properties as depicted in Table 1 are given for its low-density polyethylene (LDPE) precursor. In an embodiment, the layer 4, "Handle" is polyethylene terephthalate (PET) and a thin Kynar polyvinylidene fluoride (PVDF) layer.

TABLE 1

| Layer Name [#] | Composition | Thickness (μm) | Modulus (GPa) | CTE (ppm C$^{-1}$) |
|---|---|---|---|---|
| Glass [#1] | Glass (AF45, SLG) | 700, 3000 | 66, 73 | 4.5, 8.3 |
|  | TCO | 0.3 | 62.4-75.1 | 3.76 |
| Solar Cell [#2] | CdS | 0.1 | 70 | 4.7 |
|  | CdTe | 4 | 52 | 4.9 |
|  | (Au) | 0.1 | 78 | 14.2 |
| Stressor [#3] | EVA | 150 | ~0.15 | 100-200 |
| Handle [#4] | PET | 130 | 2.76-4.14 | 65 |
|  | Kynar ® PVDF | 30 | 1.7 | 150 |

In describing delamination, strain energy (U) plays a central role, as it creates the driving force for failure because energy is released during crack growth. Parameters of interest used to calculate U (as described below) are stress (σ), strain (ε), Young's modulus (E), Poisson's ratio (υ), and thickness (h). The strain energy in a stressed material of volume V is $$U = V\int \sigma d\varepsilon. \qquad (1)$$

For linear elastic materials (σ=Eε), $$U = \tfrac{1}{2} V \sigma \varepsilon = \tfrac{1}{2} V E \varepsilon^2. \qquad (2)$$

In an embodiment, all layers presented here are not linearly elastic, and this is only a simplification. The stressor layer (EVA) is viscoelastic, meaning that there is a viscous component that resists shear strain linearly with time when stress is applied. This results in a change in strain rate, rather than strain, with changing stress. Consequences of this material property will be discussed later.

Assuming that the lateral dimensions of the film are much greater than the thickness, the interior of the film (far away from the edges) is under equibiaxial tension, meaning that stress is equal in lateral directions, but not in the vertical. Under this assumption, we can replace V with h and E with $$\frac{E}{1-\upsilon}$$

in Eq. (2) and re-write $$U = \frac{hE\varepsilon^2}{2(1-\upsilon)}. \qquad (3)$$

The strain energy released during delamination, commonly referred to as the energy release rate, is given by $$G = -\frac{\partial \text{Strain Energy}}{\partial A} = (U_t + U_b) - U_i \qquad (4)$$

where A is crack length, $U_t$ and $U_b$ are the strain energy in the top and bottom sub-stacks behind the delamination front, respectively, and $U_i$ is the strain energy in the intact stack ahead of the delamination front (FIG. 2). Delamination will occur at a given interface if $G \geq G_c$, where $G_c$ is the interface fracture toughness, measured in J/m².

Equation (3) assumes a single-layered film of thickness h on an infinitely thick substrate. In a multilayered stack, as is presented here, the expression for strain energy can become considerably more complicated as each layer is constrained by the others. This constraint generates additional stress and strain energy that causes U to change not only layer to layer, but within each layer as well. For simplicity, the interaction between layers is ignored here and it is assumed that the strain energy in a multilayered stack is simply the sum of the contributions of the various layers. In particular, $$U_i = \frac{1}{2} \sum_{k=1}^{4} \frac{h_k E_k \varepsilon_k^2}{(1 - v_k)}, \quad (5)$$

$$U_b = \frac{1}{2} \frac{h_1 E_1 \varepsilon_1^2}{(1 - v_1)}, \text{ and} \quad (6)$$

$$U_t = \frac{1}{2} \sum_{k=2}^{4} \frac{h_k E_k \varepsilon_k^2}{(1 - v_k)}. \quad (7)$$

From Eq. (4)-(7), it is shown how changing key material properties (h, E, $v$) in a single layer can increase G and make delamination more likely. An example of this is increasing E in the stressor layer by using an EVA with higher vinyl acetate content, as in particular embodiments disclosed herein.

In an embodiment, the effect of $\varepsilon$ on delamination quality was determined. In a system, $\varepsilon$ can be broken down into several terms: (1) $\varepsilon_o$—intrinsic strain between the CdTe film and glass substrate in the as-fabricated device; (2) $\varepsilon_{lam}$—compressive thermal strain that arises from differential contraction between the layers when the stack is cooled from $T_{lam}$ to ambient temperature $T_{amb}$ (~23° C.). While $\varepsilon_{lam}$ is dependent on other factors such as cooling rate and the degree to which the stressor can relax before re-solidifying, to first order, the magnitude of this strain is proportional to the temperature difference imposed during lamination $\Delta T = T_{amb} - T_{lam}$. Note that $\Delta T$ is a negative value, resulting in a compressive strain ($\varepsilon_{lam} < 0$). We can therefore write:

$$\varepsilon_{lam} \propto \int_{T_{lam}}^{23°C.} \alpha(T) \Delta T dT, \quad (8)$$

where $\alpha(T)$ is the CTE in the given temperature range, which is dominated by the high CTE of the stressor layer (Table 1); (3) $\varepsilon_{delam}$—This is an analogous compressive thermal strain again dominated by the stressor layer, and resulting from the sudden decrease in temperature $\Delta T$ from $T_{amb}$ to $T_{delam}$ of the cold bath:

$$\varepsilon_{delam} \propto \int_{23°C.}^{T_{delam}} \alpha(T) \Delta T dT; \quad (9)$$

(4) $\varepsilon_m$—final strain term which captures all mechanical contributions, such as curvature about the z-axis and elongation along the x-axis (FIG. 2). Total strain, $\varepsilon$, can therefore be written as:

$$\varepsilon = \varepsilon_o + \varepsilon_{lam} + \varepsilon_{delam} + \varepsilon_m. \quad (10)$$

Among these four contributions, the intrinsic stress ($\varepsilon_o$) and mechanical contributions ($\varepsilon_m$) are fixed by the materials and processes employed during initial device fabrication. In principle, these can be manipulated. For example, it is well-known in CdTe that more aggressive $CdCl_2$ treatment makes a device more susceptible to delamination. However, in general it is desirable to use fabrication conditions that maximize device performance and independently control the delamination process. For a given device architecture there are several adjustable parameters to manipulate, including the thickness and physical properties (h, E, $\alpha$) of the stressor layer and the conditions used for lamination and delamination. From Eq. (8)-(10), two parameters were recognized that may be varied to control $\varepsilon$: $T_{lam}$ and $T_{delam}$. Namely, increasing $T_{lam}$ increases the strain energy in the film prior to delamination, making it easier for the film to delaminate. Likewise, decreasing $T_{delam}$ increases the driving force for delamination As disclosed herein, the impact of device architecture, $T_{lam}$, and $T_{delam}$ on the delamination process was determined.

Figures 3A, 3B, 3C, 3D:
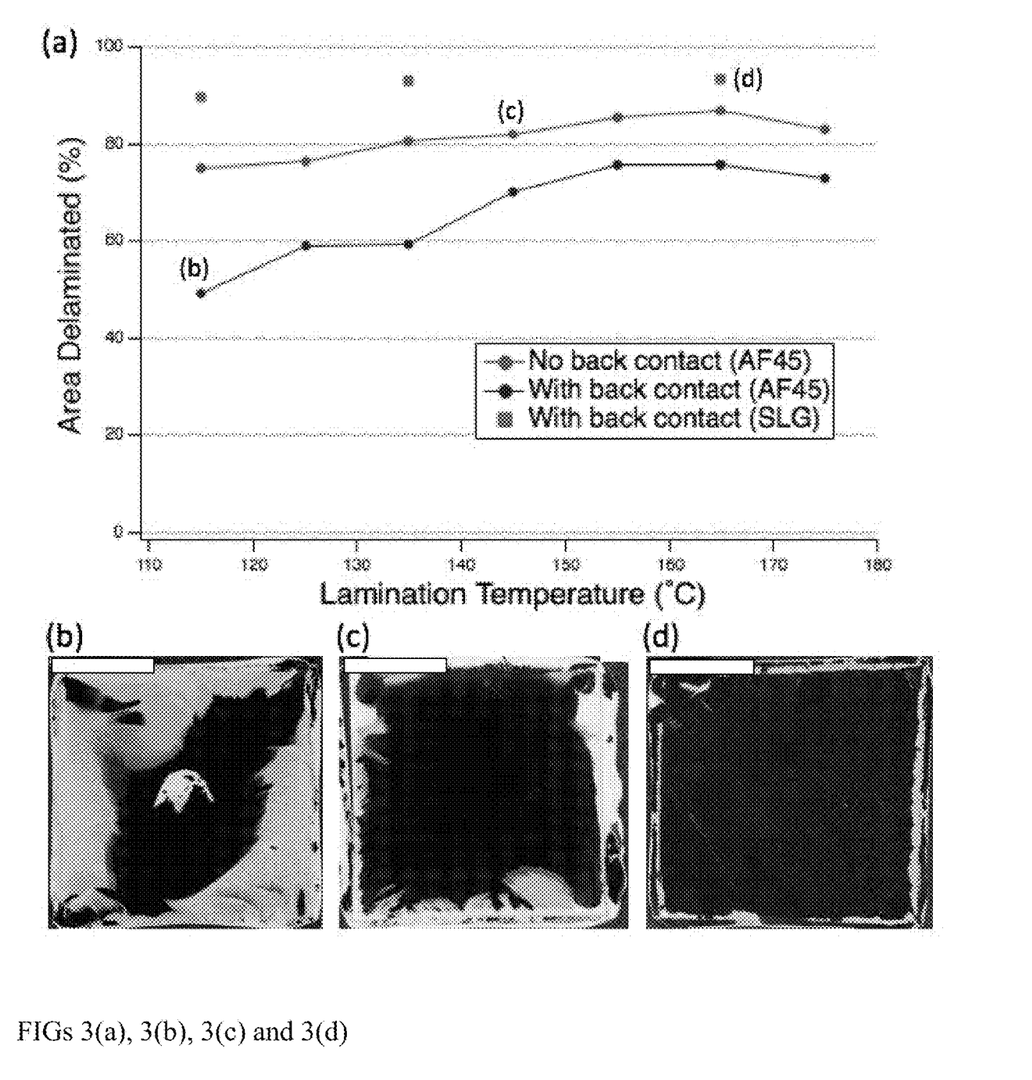

FIG. 3 quantifies the quality of delamination (measured in % area delaminated) as a function of device architecture and lamination temperature. FIG. 3a depicts improved delamination quality with increasing $T_{lam}$ with performance saturating for $T_{lam} > 150°$ C. Above $T_{lam} \approx 170°$ C., delamination quality decreases because of melting in the PET handle. Without being bound by theory, this decrease in delamination yield is caused by phase transitions in the PET/Kynar handle, specifically melting in the Kynar layer where $T_{melt} = 168°$ C. It was also determined that delamination quality is influenced by device architecture. In particular, devices with no Au back contact had consistently higher delamination yields than identically prepared samples with Au back contacts. This is because crack propagation is slowed and energy is lost due to plastic deformation of the ductile Au layer. However, the presence of a ductile back contact does not necessitate poor delamination. In an embodiment, the devices with the highest delamination yields (green in FIG. 3a) had the Au layer present. The difference between the worst (FIG. 3b) and best series (represented in FIG. 3d) was the substrate used—AF45 and SLG, respectively. Without being bound by theory, this is because the SLG substrate has a larger CTE mismatch with CdTe (SLG=8.6, CdTe=4.9, AF45=4.5 ppm C$^{-1}$) (Table 1), which increases the intrinsic strain ($\varepsilon o$) in the as-fabricated devices and aids in delamination when the system is thermally shocked. Under these conditions, delamination is essentially perfect with the exception of edge effects introduced by the laser scribing procedure (FIG. 3d).

Figure 4:
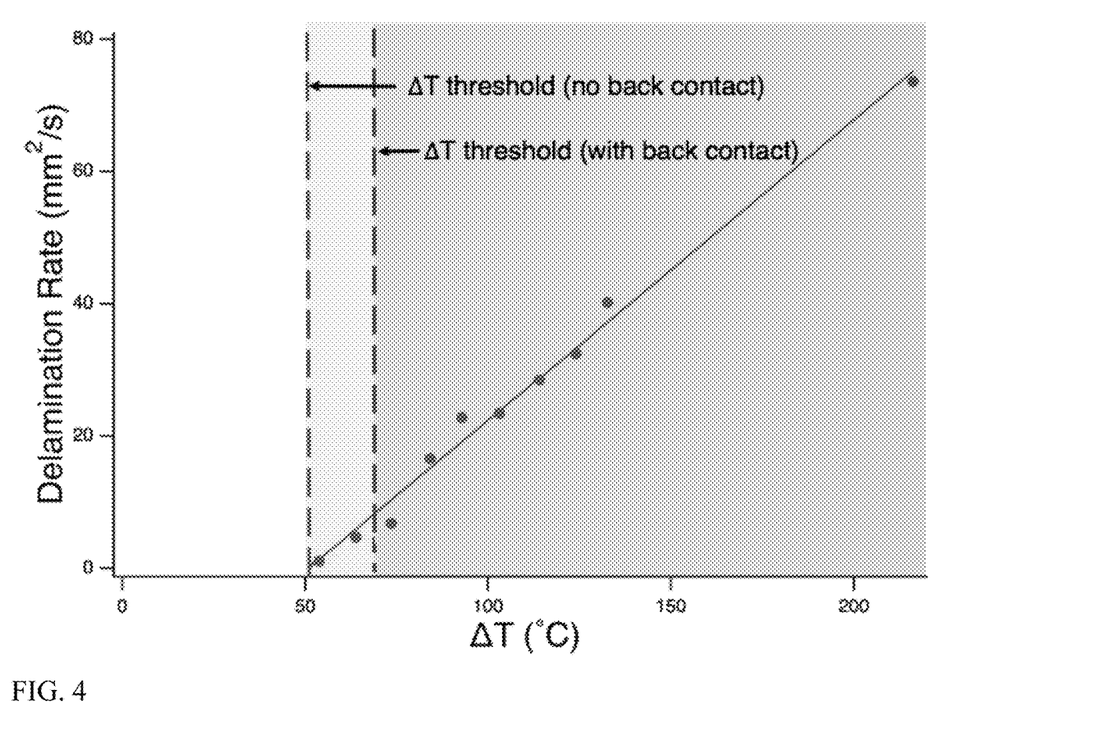
FIG. 4 depicts a plot of delamination rate as a function of $\Delta T=T_{amb}-T_{delam}$. The lowest possible $\Delta T$ to initiate delamination ($\Delta T$ threshold) is higher for samples with ductile back contact, implying that these require more energy to delaminate.

$T_{delam}$ was varied and was found to influence delamination rate rather than quality (FIG. 4). By increasing $T_{delam}$, the thermal strain energy (driving force, $\Delta T = T_{amb} - T_{delam}$) was decreased that was available during delamination. Due to the viscoelastic nature of the stressor layer, this causes a decrease in strain rate which slows the propagation of the delamination front.

Eventually, a point is reached at which the thermal strain energy is insufficient to initiate delamination, referred to as the $\Delta T$ threshold here. In samples with no back contact (red in FIG. 4), this value was found by measuring the delamination rate at a series of $T_{delam}$ (measured in 10° C. increments) and extrapolating to find the value at which delamination rate was zero. This was found to be $\Delta T$ 51° C., corresponding to $T_{delam} = -28°$ C., which was very close to the lowest measured $T_{delam}$ of $-30°$ C. At $T_{delam} = -30°$ C., a 1 cm² area delaminated in ~1.3 minutes, whereas at $T_{delam} = -196°$ C. (liquid nitrogen), a 1 cm² area delaminated in only ~1.3 seconds. The $\Delta T$ threshold value for samples with back contacts was determined by testing low values first, then increasing $\Delta T$ until delamination was achieved, which was found to be $\Delta T \approx 69°$ C. (corresponding to $T_{delam} = -46°$ C.). This demonstrates that additional energy is required to initiate delamination in samples that have a ductile back contact, because of energy lost to plastic deformation in this layer.

The ability to control delamination rate through $T_{delam}$ can be extremely useful in process control. In an embodiment, delamination rates determined here are specific to the samples employed as well as geometry of the stressor/handle bi-layer. In particular, delamination initiates most readily at corners where stress is concentrated, which illustrates the importance of shape and aspect ratio. Because the least amount of energy is required for the delamination front to propagate along edges, a high aspect ratio may be beneficial. The handle/stressor material properties are also critical to a successful delamination process. For example, stiff (high modulus) stressor materials have been found to produce clean, reproducible delamination, but if the modulus is too high, delamination at increased $T_{delam}$ will fail. This is because there will be little to no flexibility in the stressor to allow for gradual propagation of the delamination front, so while delamination will initiate at the corners, it will not propagate. The framework developed here is expected to be extended to other polycrystalline devices, though the conditions for delamination will depend on the device material, processing conditions, and architecture, as these all influence $G_c$. For example, it was found that some epoxies, such as Hysol 1C (E≳1 GPa at ambient temperature), produce clean delamination at very low $T_{delam}$ (−196° C.), but at elevated temperatures ($T_{delam}$~−80° C.), delamination only initiates at corners and does not propagate.

Figure 7:
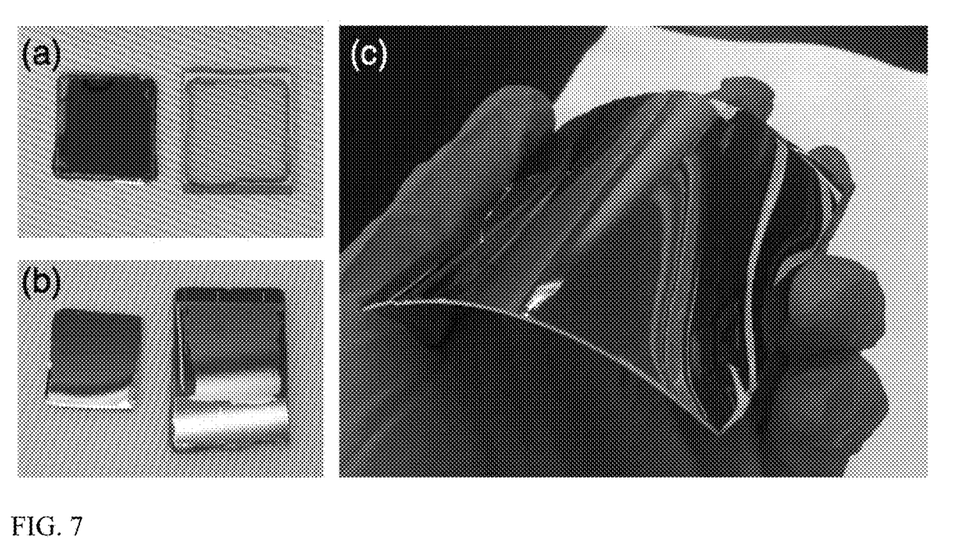
FIG. 7 depicts images of delaminated (a) superstrate CdTe device with CdS/TCO interface exposed; (b) substrate CIGS device with CIGS/Mo interface exposed where delaminated areas are ~1.5×1.5 cm². (c) Large area (~3×3") delaminated CIGS on Kynar/PET/EVA (KPE) backsheet.

These types of considerations should be taken into account, particularly when attempting to lift off diverse polycrystalline thin-film stacks, as $G_c$ (the energy required to delaminate) depends on many factors including device material, processing conditions, and device architecture. For example, processing conditions can lead to accumulations of 2-D materials at buried interfaces in some thin-film photovoltaic technologies, such as $CdCl_2$ in CdTe and $MoSe_2$ in CIGS. This drastically reduces $G_c$, making the application of the lift-off technique presented here straightforward. For example, substrate CIGS device stacks can be cleanly delaminated in exactly the same manner as CdTe, with no further optimization to the technique or materials (FIGS. 7a-b). Areas of CIGS of about 3×3" have been cleanly lifted off using the same process (FIG. 7c).

In an embodiment, methods disclosed herein for a successful lift-off include the following considerations and steps: (1) use a growth substrate with relatively high CTE mismatch compared to the thin film, but not so high as to cause delamination during device growth; (2) delaminate in liquid nitrogen, which causes high thermal strain and is inert; (3) increase elastic modulus and/or CTE of stressor if unsuccessful.

Device performance before and after delamination was measured under standard test conditions (1000 W m$^{-2}$, 25° C., AM1.5G). FIG. 5 compares the J-V behavior of the devices at various stages and the corresponding contacting geometries employed. Here, initial device efficiency was ~14% (black curve in FIG. 5a). Following delamination, efficiency dropped to 10.7% (red curve in FIG. 5a), due a combination of 100 mV decrease in open-circuit voltage ($V_{oc}$), a loss of 1.5 mA/cm$^2$ in short-circuit current density ($J_{sc}$) and a 5.2% drop in the fill factor (FF). The small decrease in $J_{sc}$ observed is an improvement over previous work in which $J_{sc}$ dropped by almost 50% following delamination due to device cracking. As disclosed herein, cracking was eliminated by using SLG substrates, which have a higher CTE mismatch with CdTe and allow for cleaner delamination, in conjunction with laser scribing prior to delamination (FIG. 3).

Figure 5A:
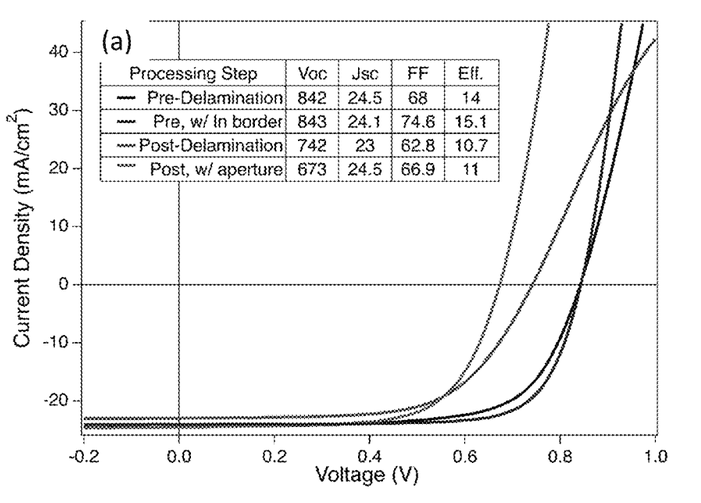
FIG. 5(a) depicts J-V curves for a CdTe device before delamination (black curve), before delamination with indium border added (blue curve), after delamination (red curve), and after delamination with Ni aperture (green curve). Illustrations of side and top view during J-V measurements for 5(*b*) superstrate pre-delamination device, 5(*c*) substrate post-delamination device, and 5(*d*) substrate post-delamination device with Ni aperture.
Figure 5B:
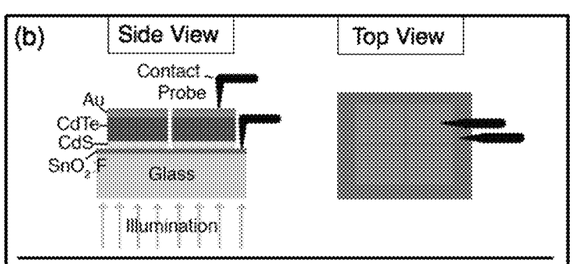
Figure 5C:
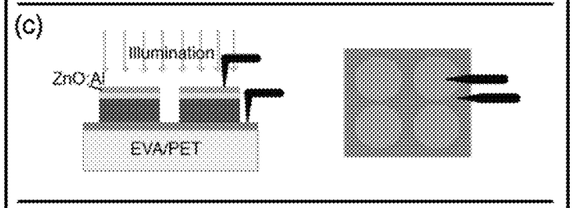
Figure 5D:
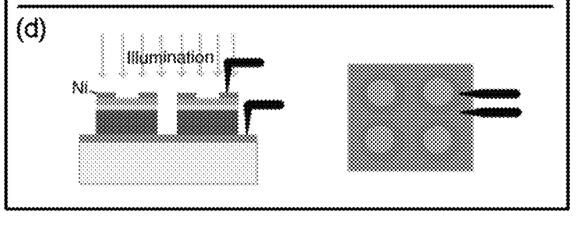
Figure 6:
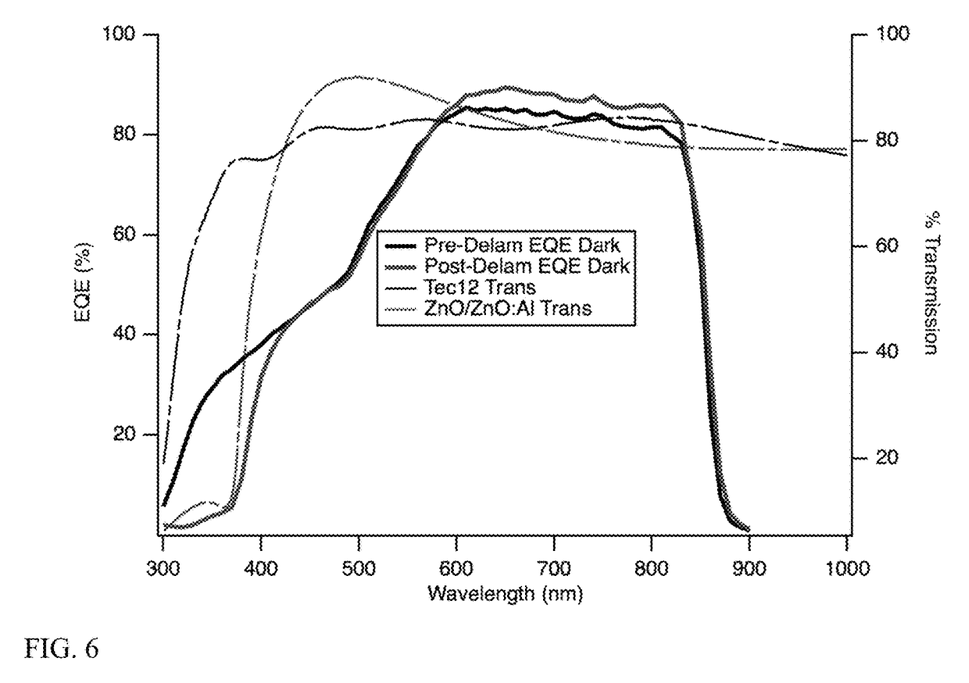
FIG. 6 depicts percentage EQE and percentage transmission of varying wavelengths through various samples.

Comparison of quantum efficiency spectra show nominally identical behavior throughout the CdS/CdTe portion of the spectrum, reflecting the integrity of these layers after delamination. There is a small loss of current below 400 nm, reflecting the lower band gap of ZnO/ZnO:Al relative to FTO/TO. Additionally, shadowing losses from contact probes during J-V measurements of post-delamination devices (substrate configuration) are not present in pre-delamination devices (superstrate configuration) (FIGS. 5b-c). In an embodiment, the decrease FF may be attributed to a new front contact that has not been fully adjusted. The sputtered ZnO/ZnO:Al layer has a sheet resistance of 59.5 Ω/square compared to 12.5 Ω/square for an original $SnO_2$:F/$SnO_2$, which is evidenced by the increased series resistance. By defining the device area with a metal (Ni) aperture (FIG. 5d), both the shadowing and conduction limitations may be configured, and the initial $J_{sc}$ is fully recovered and the original FF (green curve in FIG. 5a) may also be fully recovered.

The Ni aperture also shades a substantial portion of the active cell and effectively creates a dark device in parallel with the illuminated device, reducing $V_{oc}$. Thus, through proper configuration of the front contact and by using an appropriate anti-reflection coating, $J_{sc}$ and FF can be restored to their original value.

In an embodiment, the 100-mV loss in Voc between pre- and post-delamination devices may reflect a loss in integrity of the $CdCl_2$ layer that appears important for passivation of this interface. Alternatively, this loss may be the result of interface defects or the varied band offsets between the TCO and CdS before and after lift-off. Delamination provides access and an opportunity to modify and/or redesign the heterojunction and potentially boost voltage if the interface can be more effectively passivated.

Using methods disclosed herein, the specific power (W kg$^{-1}$) of thin-film CdTe is increased by using commercially-manufacturable, high-efficiency cell technology. Specific power is directly proportional to the cell efficiency and inversely proportional to the device mass. A corrected post-delamination efficiency of 11.4% was calculated by correcting current density values in the post-delamination device (no aperture) to reflect the true $J_{sc}$ of 24.5 mA cm$^{-2}$ resulting from a measured device area of ~12 mm$^2$. The areal density of the post-delamination device was found to be 350 gm$^{-2}$. In an embodiment, a pre-delamination device on glass had 14% efficiency and an areal density of 7,830 gm$^{-2}$. Disclosed herein are methods that allow for the maintenance of 80% of the efficiency while decreasing an areal density by over an order of magnitude without significantly increasing cell production costs. This results in low-cost PV with high specific power. Furthermore, the resulting delaminated films are flexible, and the handle and stressor layers can be designed to fit the desired final application. The methods disclosed herein are useful for designing a final lightweight packaging.

In an embodiment, methods for the thermo-mechanical lift-off of CdTe thin-films from glass growth substrates are disclosed herein. Equations were developed to describe thermo-mechanical delamination of thin-film solar cells and found several tunable control parameters. Thermal strain was controlled through $T_{lam}$ and $T_{delam}$ and both delamination yield and rate as a function of these key parameters were measured, respectively. Additional parameters that can be tuned to achieve lift-off in diverse thin-film systems include strain that can be altered in numerous ways, as well as choosing the stressor and handle material to have higher CTE, elastic modulus, and/or thickness to improve delamination quality. Improved delamination can be achieved by modifying device architecture, such as removing the ductile back contact or choosing a substrate with a relatively high CTE mismatch compared with the thin-film device. Using the methods and devices disclosed herein, an 11% efficient lifted-off device is disclosed that retained ~80% of its original efficiency while simultaneously reducing its areal density by over an order of magnitude.

As disclosed herein, the thermo-mechanical lift-off technique imparts the benefit of exposing previously buried regions of thin-film devices. In superstrate CdTe, delamination allows direct access to the heterojunction region, making it easily studied through standard surface analysis techniques. Likewise, delamination of substrate CIGS films, as disclosed herein, allows for direct access to the previously buried CIGS/Mo interface. Thus, by using methods and techniques disclosed herein, the lift-off technique decouples final lightweight packaging from high-temperature growth requirements in order to enable high specific power PV at low costs, and enables analysis of buried interfaces in a wide variety of thin-film device stacks.

Material and Methods

CdTe devices were grown in the superstrate configuration using either an alkali-free CTE-matched glass (AF45) or soda-lime glass (SLG). The glass was coated with a $SnO_2$:F/$SnO_2$ transparent conducting oxide (TCO) using chemical vapor deposition. 100 nm of cadmium sulfide (CdS) was deposited via rf magnetron sputtering in an oxygen/argon ambient. CdTe (~4 μm) was then deposited using close-spaced sublimation (CSS) in an oxygen/helium ambient with AF45 substrates held at 600° C. and SLG substrates at 550° C. Vapor-phase $CdCl_2$ annealing was also performed in a CSS configuration with the substrate temperature fixed at 415° C. in an oxygen/helium ambient. To explore the effect on device performance stability, the back contact was deposited in two ways: (1) a Cu/Au bi-layer was evaporated and annealed post-deposition to promote Cu diffusion, and (2) a Au layer was evaporated after soaking the device in 0.1 mM $CuCl_2$ solution and annealing. The device architecture can be seen in the inset of FIG. 1a.

The choice for a flexible packaging material is an analog to the polymeric backsheets used commercially in silicon PV modules. These multilayer laminates include polyethylene-co-vinyl acetate (EVA) as an adhesive and insulating dielectric film(s) that protect the photovoltaic module from UV, liquid water, and weather. In an embodiment, a "KPE" triple-layer backsheet was used that consisted of Kynar polyvinylidene fluoride (PVDF, ~30 μm), polyethylene terephthalate (PET, ~130 μm), and low vinyl-acetate content EVA (~150 μm) with 9 μm of acrylate-based adhesive between each layer. In an embodiment, the "handle" may be considered as the combined Kynar/PET bi-layer, and the "stressor" as the EVA layer. This backsheet was adhered to the back contact (FIG. 1a) through vacuum lamination. During this process, the stack was pressed together with a constant pressure under vacuum for ~10 minutes, and simultaneously heated to a maximum lamination temperature, $T_{lam}$, which was varied from 115 to 175° C. The stack was then removed and allowed to cool naturally to ambient temperature. Following lamination, a square perimeter was laser scribed into the CdTe film through the glass substrate using a Nd:$YVO_4$ laser. This step has been found to drastically reduce film cracking, which has been previously been an unsolved problem. Next, the stack was submerged in a bath of temperature $T_{delam}$, ranging from −196° C. (liquid nitrogen) to −30° C. [ethyl alcohol ($T_{freeze}$=−114° C.) mixed with liquid nitrogen], to induce delamination.

Figures 1A, 1B:
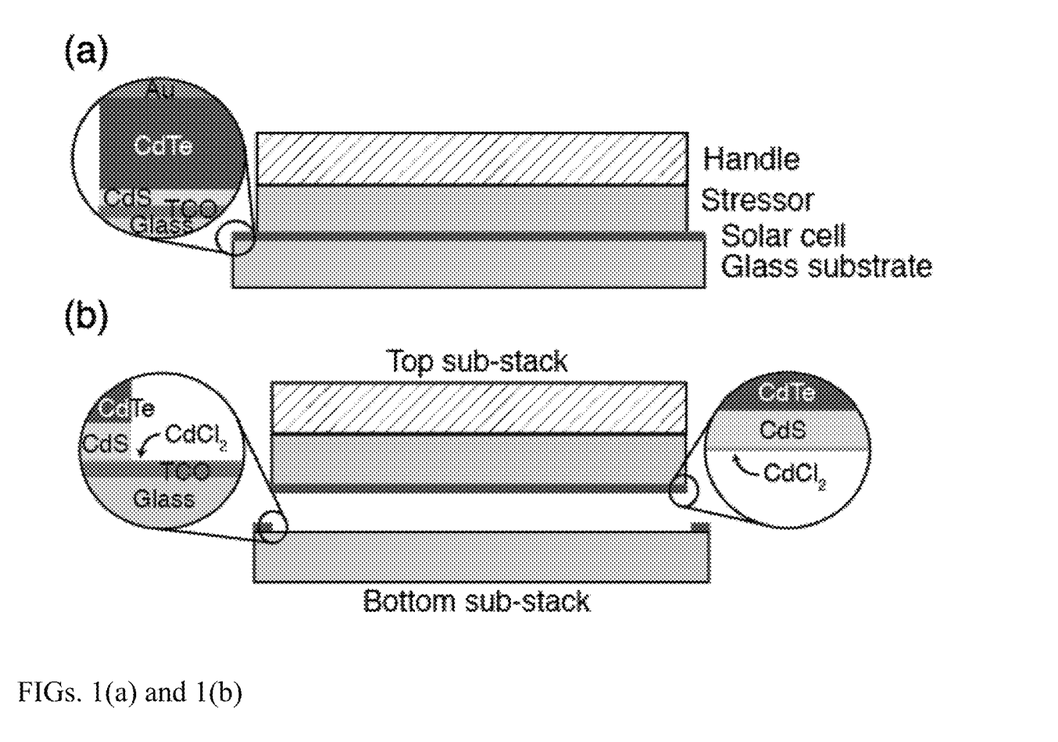

By thermo-mechanically delaminating CdTe device stacks described above and using angle resolved x-ray photoelectron spectroscopy (ARXPS) to analyze the newly exposed CdS/TCO interface, a half-monolayer accumulation of $CdCl_2$ on either side of the cleave was observed see, for example, FIG. 1b. Without being bound by theory, this accumulation of $CdCl_2$, which is a 2-D layered material bonded only through relatively weak van der Waals bonds, is thought to be useful for obtaining reproducible, clean delamination at the CdS/TCO interface. This layer is also thought to play an important role in maintaining open-circuit voltage in CdTe devices, as intentional removal of it (by rinsing with DI water) was observed to be detrimental to device performance. Therefore, in order to preserve chemistry at the newly exposed CdS/TCO interface, most films (apart from those with varied $T_{delam}$) were lifted off in liquid nitrogen within a nitrogen-filled glovebox. Following lift-off, the top and bottom sub-stacks were withdrawn from the bath into a stream of dry nitrogen gas until room temperature was reached. Images of delaminated CdTe films were captured using a Keyence VHX5000 optical microscope and analyzed using ImageJ to quantify total delaminated area. Videos of delamination were also captured and analyzed frame by frame to determine delamination time, defined as the length of time between device immersion in the cold bath and completion of delamination. Delamination times were then divided by the respective measured area to obtain delamination rates.

Because delamination occurs at the CdS/TCO interface, the front contact (TCO) is separated from the delaminated film and must be restored following lift-off. For this, a ZnO/ZnO:Al TCO bi-layer was sputtered, with no intentional heating, onto the delaminated film. A selective etch was then performed to expose the back contact by using circles of Shipley S1818 photoresist (diameter ~4 mm) as an etch mask and ferric chloride as the etchant. On a separate device, a thin (~50 nm) nickel aperture was evaporated on top of the ZnO/ZnO:Al bi-layer to define device area for more accurate current density measurements, before the back contact was subsequently exposed using the above disclosed methods.

The foregoing disclosure has been set forth merely to illustrate the invention and is not intended to be limiting.

We claim:

1. A method for making a CdTe device stack film comprising the steps of laminating a CdTe device stack on a CdS layer of a substrate wherein the substrate comprises glass and a transparent conducting oxide (TCO) layer on top of the glass and a CdS layer on top of the TCO layer; and wherein the CdTe device stack laminated on a CdS layer of a substrate is laminated to a stressor layer wherein the stressor layer and the CdTe device stack have a coefficient of thermal expansion (CTE) mismatch between the stressor layer and the CdTe device stack and wherein the CdTe device stack is delaminated from the substrate to make the CdTe device stack film wherein the delamination of the CdTe device stack film from the substrate takes place at temperatures between about −30° C. and −135° C.; and further comprising applying a transparent front contact to the CdTe device stack film after the delamination step; and wherein the CdTe device stack film has a post-delamination efficiency of at least 11.4%.

2. The method of claim 1 wherein the stressor layer comprises a handle layer.

3. The method of claim 1 wherein the CdTe device stack film is crack-free.

4. A method for making a $CuIn_xGa_{1-x}Se_2$ (CIGS) device stack film comprising the steps of laminating a CIGS device stack on a molybdenum layer of a substrate wherein the substrate comprises glass and a transparent conducting oxide (TCO) layer on top of the glass and a molybdenum layer on top of the TCO layer; and wherein the CIGS device stack laminated on a molybdenum layer of a substrate is laminated to a stressor layer wherein the stressor layer and the CIGS device stack have a coefficient of thermal expansion (CTE) mismatch between the stressor layer and the CIGS device stack and wherein the CIGS device stack is delaminated from the substrate to make the CIGS device stack film wherein the delamination of the CIGS device stack film from the substrate takes place at temperatures between about −30° C. and −135° C.; and further comprising applying a transparent front contact to the CIGS device stack film after the delamination step.

5. The method of claim 4 wherein the stressor layer comprises a handle layer.

6. The method of claim 4 wherein the CIGS device stack film is crack-free.

\* \* \* \* \*